United States Patent [19]

Tachi et al.

[11] 3,928,091

[45] Dec. 23, 1975

[54] METHOD FOR MANUFACTURING A SEMICONDUCTOR DEVICE UTILIZING SELECTIVE OXIDATION

[75] Inventors: Seiichi Tachi; Hideki Moriyama, both of Kodaira, Japan

[73] Assignee: Hitachi, Ltd., Japan

[22] Filed: Aug. 12, 1974

[21] Appl. No.: 496,899

Related U.S. Application Data

[62] Division of Ser. No. 292,640, Sept. 27, 1972, abandoned.

[30] Foreign Application Priority Data

Sept. 27, 1971 Japan ................................ 46-74684
Oct. 20, 1971 Japan ................................ 46-82457
Oct. 10, 1971 Japan ................................ 46-88994

[52] U.S. Cl. .................... 148/175; 29/577; 29/580; 148/191; 156/612; 357/20; 357/50; 357/90

[51] Int. Cl.[2] .................... H01L 21/76; H01L 27/04

[58] Field of Search ...... 148/175, 187, 191; 357/50; 29/577, 580

[56] References Cited

UNITED STATES PATENTS

| | | | |
|---|---|---|---|
| 3,386,865 | 6/1968 | Doo | 148/175 |
| 3,529,217 | 9/1970 | Van Santen | 357/48 |
| 3,557,444 | 1/1971 | Ruoff | 29/577 |
| 3,581,165 | 5/1971 | Seelbach et al. | 357/48 |
| 3,648,125 | 3/1972 | Peltzer | 357/50 |

OTHER PUBLICATIONS

Kooi et al., "Locos Devices" Philips Res. Repts. 26, pp. 166–180, 1971.

Cooi et al., "Selective oxidation of silicon and its device applications" Semiconductor silicon (textbook), Proc. of May 1973 Electrochem. Soc. Conf. pp. 860–879.

*Primary Examiner*—R. Dean
*Assistant Examiner*—W. G. Saba
*Attorney, Agent, or Firm*—Craig & Antonelli

[57] ABSTRACT

An $N^+$ region and a $P^+$ region adjacent thereto are formed on a major surface of a $P^-$ silicon substrate, an $N^-$ silicon layer is epitaxially grown on the major surface and the epitaxial layer is partially oxidized using silicon nitride as a mask therefor, so as to form an $SiO_2$ layer reaching the $P^+$ and $N^+$ regions with a ring shape, whereby the $N^-$ silicon layer surrounded by the $SiO_2$ layer is electrically isolated from the other portions of the N silicon layer substantially without leakage current.

7 Claims, 13 Drawing Figures

METHOD FOR MANUFACTURING A SEMICONDUCTOR DEVICE UTILIZING SELECTIVE OXIDATION

This is a division of application Ser. No. 292,640, filed Sept. 27, 1972, now abandoned.

The present invention relates to a semiconductor device, especially to a semiconductor integrated circuit device and a method for making the same.

There has been known an isolation technique for electrically isolating circuit elements which uses a semiconductor oxide formed by selectively oxidizing a semiconductor body. In this technique, however, the present inventors found there are problems in that it is very difficult to obtain excellent isolation characteristics substantially without leakage current and also that an electrode cannot be easily formed on the semiconductor substrate. They have found that when the semiconductor body is selectively oxidized, the impurities doped therein are accumulated in the body surface just below the newly formed semiconductor oxide film, an undesirable current path or channel layer is formed and thus excellent isolation characteristics cannot be expected. To remedy this problem, they have invented an improved structure for a semiconductor integrated circuit device having an excellent isolation characteristic and a method for making the same.

An object of the present invention is to provide an improved semiconductor integrated circuit device having an excellent isolation characteristic and to provide a method for making the same.

Another object of the present invention is to provide an improved semiconductor integrated circuit device and a method for making the same in which an electrode can be easily formed on the semiconductor substrate.

The foregoing objects, advantages and features of the present invention will be explained with reference to the attached drawings as follows.

FIGS. 1(*a*) to 1(*e*) show cross-sectional views of a semiconductor integrated circuit body at various manufacturing steps for explaining a process according to the present invention.

FIGS. 2(*a*) to 2(*g*) show cross-sectional views of a semiconductor integrated circuit device at various manufacturing steps for explaining another process according to the present invention.

Figure 1A:
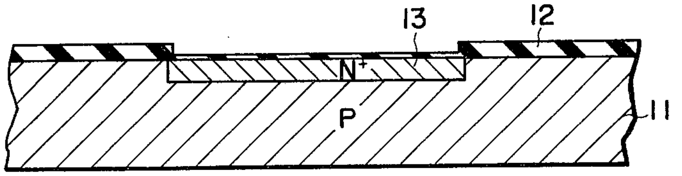
Figure 1B:
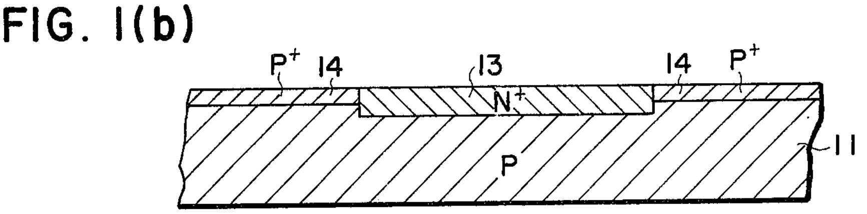
Figure 1C:
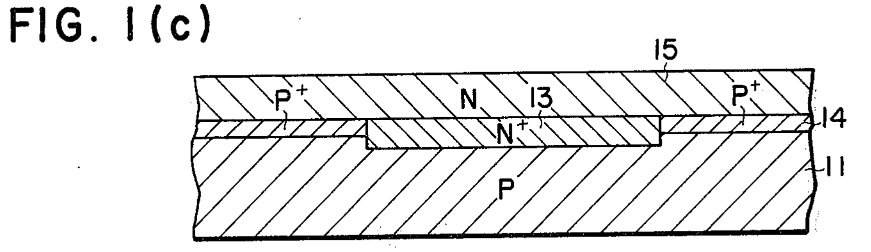
Figure 1D:
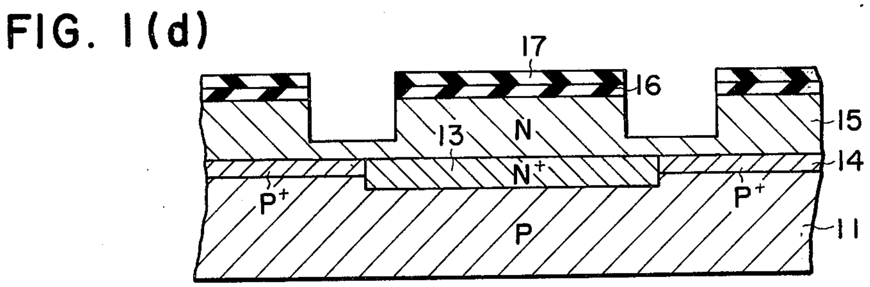
Figure 1E:
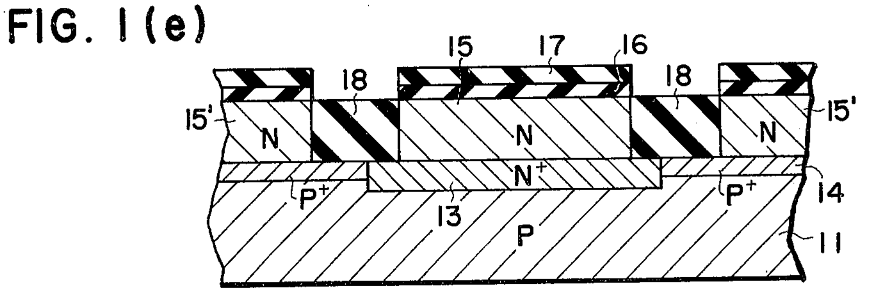
Figure 2A:
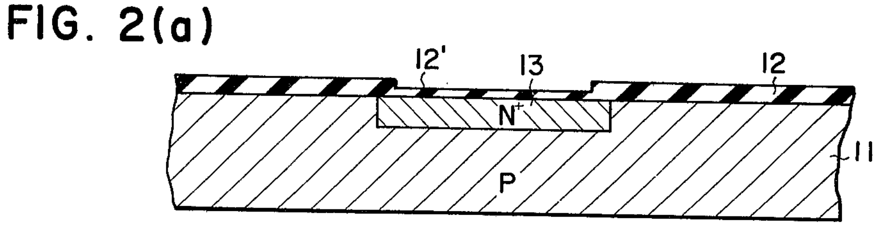
Figure 2B:
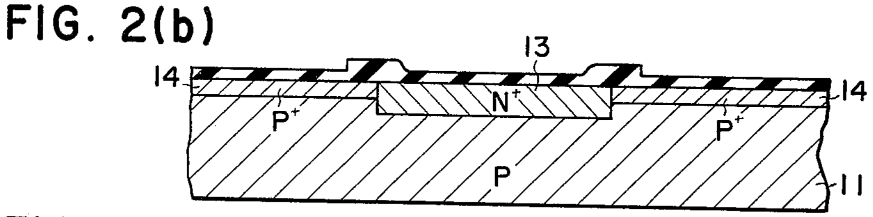
Figure 2C:
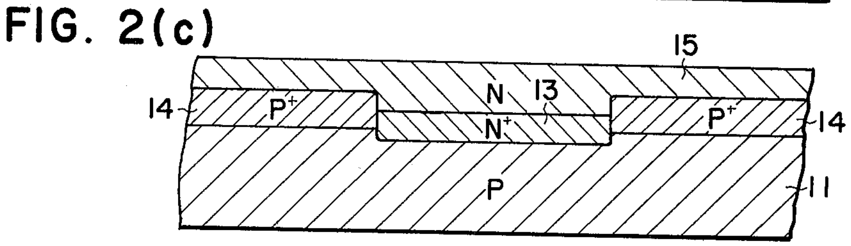
Figure 2D:
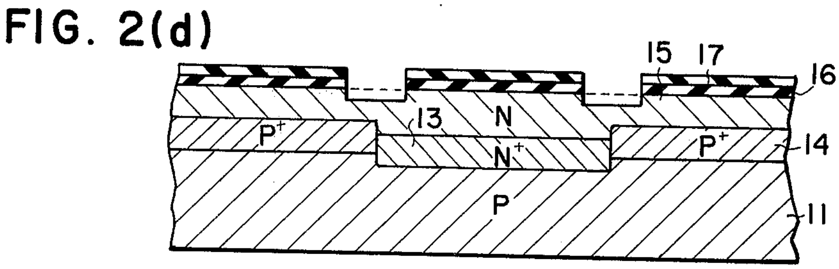
Figure 2E:
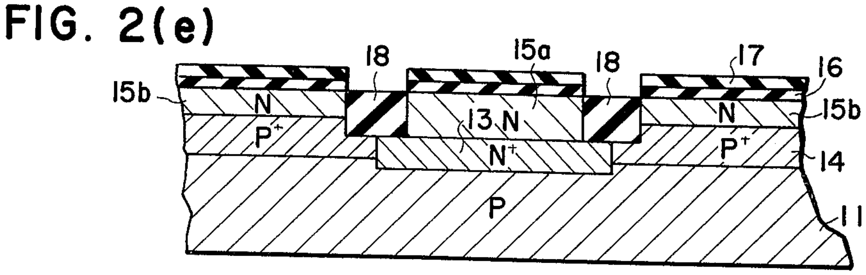
Figure 2F:
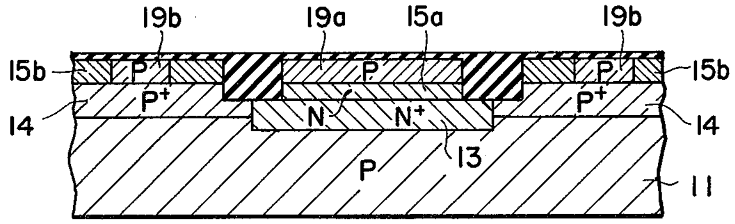
Figure 2G:
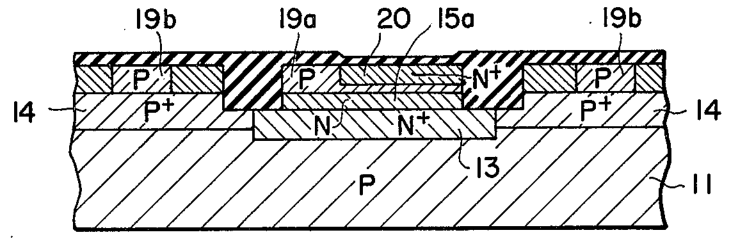
Figure 3:
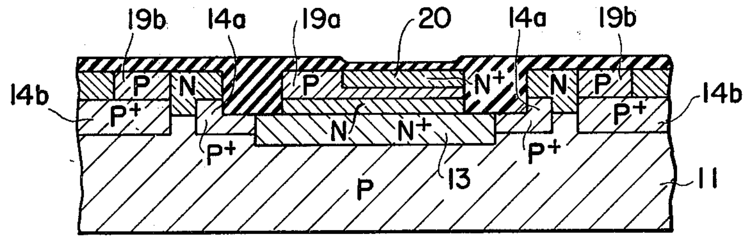

FIG. 3 shows a cross-sectional view of a semiconductor integrated circuit device according to another embodiment of the present invention.

EMBODIMENT 1

An integrated circuit device having an improved isolation structure according to the present invention is shown in FIG. 1(*e*). The steps for manufacturing the same are shown in FIGS. 1(*a*) to 1(*e*).

a. A silicon oxide film 12 is formed by a thermal oxidizing process on a major surface of a P type silicon monocrystalline substrate 11 having a thickness of about 280$\mu$ and a specific resistivity of about 20 to 30 ohm-cm. By using a well-known photo-etching process, a part of the silicon oxide film 12 is selectively removed and, by using the remaining $SiO_2$ film as a mask, an N type impurity, for example, arsenic is selectively diffused into the silicon substrate to form a heavily doped $N^+$ type diffused region 13 having a surface impurity concentration of about $10^{20}$ atoms/cm$^3$ as shown in FIG. 1(*a*).

b. At the surface portion of the silicon substrate, where the $N^+$ type region was not formed, a heavily doped $P^+$ type semiconductor region 14 is formed. The $P^+$ type region may be formed by removing selectively or completely the remaining $SiO_2$ film in the step (a) and shallowly diffusing a P type impurity, for example, boron into the substrate to form a shallow $P^+$ type region having a surface impurity concentration of about $10^{17}$ atoms/cm$^3$ as shown in FIG. 1(*b*). Instead of the above-mentioned process the $P^+$ type region 14 may be formed by removing completely the $SiO_2$ film in the step (a) and thinly growing a heavily doped $P^+$ type silicon layer having an impurity concentration of about $10^{17}$ atoms/cm$^3$ on the entire main surface of the substrate. It should be noted that the $P^+$ type epitaxial layer formed on the $N^+$ type region 13 is compensated by auto-doping of the more heavily doped N type impurity.

c. Then, an $N^-$ type silicon layer 15, namely an $N^-$ type epitaxial silicon layer having a thickness of about 2$\mu$ and a specific resistivity of about 0.2 to 0.4 ohm-cm is epitaxially deposited on the entire main surface of the substrate by thermally reacting a silicon compound such as silicon tetrachloride ($SiCl_4$) with $H_2$ together with the introduction of an N type impurity. As a result, the $N^+$ type region 13 and the $P^+$ type region 14 are buried under the $N^-$ type epitaxial Si layer 15 as shown in FIG. 1 (*c*).

d. On the main surface of the $N^-$ type epitaxial Si layer 15, a silicon nitride ($Si_3N_4$) film 16 having a thickness of about 2,000 to 2,500A is formed by thermally decomposing a gas mixture of monosilane ($SiH_4$) and ammonia ($NH_3$). Then, on the silicon nitride film 16 an $SiO_2$ film 17 having a thickness of about 4,000 to 6,000 A is formed by reacting monosilane ($SiH_4$) with oxygen ($O_2$) at a relatively low temperature of about 400°C. A portion of the $SiO_2$ film 17 is etched away with a ring-like shape surrounding the $N^+$ type buried region 13 by using a well-known photo-etching process and using an etchant containing HF. The exposed silicon nitride film is etched away by using the remaining $SiO_2$ film 17 as a mask and by using an etchant of boiling phosphoric acid, whereby a surface portion of the $N^-$ type epitaxial Si layer 15 is exposed. Then the exposed surface portion of the $N^-$ type epitaxial Si layer 15 is selectively etched to form a groove having a ring-like shape and having a depth of about 1.2$\mu$ therein as shown in FIG. 1 (*d*).

e. Then the substrate is subjected to an oxidizing treatment in an oxygen atmosphere at about 1000°C for about 13 hours using the remaining $Si_3N_4$ film 16 as a mask, so as to form a silicon oxide layer 18 reaching the P type Si material, as shown in FIG. 1 (*e*). Thus, the thick $SiO_2$ layer 18 works as an isolation layer for the semiconductor integrated circuit device.

According to the above-mentioned process, even if the N type impurity doped in the N type epitaxial layer 15 is accumulated at the P type substrate surface beneath the $SiO_2$ layer 18 in the step (e), the accumulated N type impurity can be compensated by the P type impurity in the $P^+$ type region 14 having a predetermined impurity concentration sufficient to compensate the accumulated impurity, whereby and N type inversion layer or channel layer is not formed on the body surface just below the $SiO_2$ layer 18. Thus, a plurality of N type regions 15, 15' surrounded by the $SiO_2$ layer 18 are completely electrically isolated from each other through the $SiO_2$ layer at the side surface thereof and through the PN junctions at the bottom surface thereof.

By further diffusing impurities in the isolated N type Si layers 15, 15' circuit elements such as transistors, diodes, resistors and capacitors may be formed therein and may be operated with a high degree of stability.

It will be understood in the present embodiment that the semiconductor structure as shown in FIG. 1 (*b*) may be obtained by first epitaxially growing a thin $P^+$ type Si layer on a major surface of the Si substrate 11 and then by selectively and heavily diffusing an N type impurity into the $P^+$ type epitaxial layer so as to partially change the conductivity type from $P^+$ type to $N^+$ type.

EMBODIMENT 2

Another integrated circuit device according to the present invention is shown in FIG. 2 (*g*) and the manufacturing process steps are shown in FIGS. 2 (*a*) to 2 (*g*).

a. An $SiO_2$ film 12 is formed by thermally oxidizing a P type Si monocrystalline substrate 11 having a thickness of about 200 to 300$\mu$ and a specific resistivity of about 20 to 50 ohm-cm. A part of the $SiO_2$ film 12 is removed by a well-known photo-etching process and an N type impurity such as arsenic is diffused into the substrate through the opening to form a heavily doped $N^+$ type diffused region 13 having a surface concentration of about $1 \times 10^{20}$ atoms/cm$^3$. At this step, an $SiO_2$ film 12' is newly formed on the diffused region as shown in FIG. 2 (*a*).

b. The portion of the $SiO_2$ film 12 and 12' where the $N^+$ type region was not formed is removed by a second photo-etching process. A P type impurity such as boron is diffused into the substrate to form a heavily doped $P^+$ type region 14 having a surface concentration of about $5 \times 10^{17}$ atoms /cm$^3$ which is adjacent to the $N^+$ type region 13 as shown in FIG. 2 (*b*).

It should be noted that in this step (b) that the $SiO_2$ film 12, 12' may be completely removed instead of selective removal since the $P^+$ type impurity can be compensated by the $N^+$ type impurity doped in the $N^+$ type region 13, even if the $P^+$ type impurity is diffused into the entire surface of the substrate.

c. The entire $SiO_2$ film is completely removed from the substrate surface. Then an N type monocrystalline Si layer 15 having an impurity concentration of about $10^{16}$ atoms/cm$^3$ and a thickness of about 2 to 4$\mu$ is deposited on the $P^+$ and $N^+$ type regions by thermally decomposing silicon-tetrachloride ($SiCl_4$) in $H_2$ while supplying an N type impurity. Thus, the $N^+$ type region 13 is embedded under the epitaxial layer 15 and the P type impurity in the $P^+$ type region 14 moves into the epitaxial Si layer due to so-called auto-doping, so as to define a PN junction in the epitaxial layer 15 as shown in FIG. 2 (*c*).

d. An $Si_3N_4$ (silicon nitride) film 16 is formed on the Si epitaxial layer 15 by reacting monosilane ($SiH_4$) with ammonia ($NH_3$) and thereonto a $SiO_2$ film 17 is formed in a laminated fashion by a reaction of monosilane ($SiH_4$) and oxygen ($O_2$). Then, a portion of the $SiO_2$ film 17 is etched away into a ring-shape by using an etchant of hydrofluroic acid HF and the $Si_3N_4$ film 16 is partially etched by boiling phosphoric acid, so as to expose the surface portion of the Si layer 15. The exposed Si layer 15 is lightly etched as shown in FIG. 1 (*d*) by using a mixture consisting of hydrofluoric acid, phosphoric acid and nitric acid.

e. The thus produced semiconductor body is subjected to a heat-treatment in an oxydizing atmosphere in such a way that the oxidation of the silicon epitaxial layer 15 proceeds until it reaches the P type substrate surface to form a thick $SiO_2$ film as shown in FIG. 2 (*e*). Because of the $SiO_2$ film 18, the N type Si layer **15*a* is electrically isolated from the other portions of the Si layer 15**.

f. The remaining $SiO_2$ film 17 and $Si_3N_4$ film 16 are removed and a new $SiO_2$ film is again provided on the predetermined surface portions of the Si layer 15. Then, by simulatneously diffusing a P type impurity such as boron into the N type Si layers **15*a* and 15*b*, P type regions 19*a* and 19*b* are formed. The P type impurity is diffused in such a way that the P type region 19*b* reaches or extends to the buried $P^+$ type region 14 as shown in FIG. 2** (*f*).

g. An N type impurity such as phosphorus is selectively diffused into the P type diffused region **19*a* so as to form an $N^+$ type region 20 as shown in FIG. 2** (*g*). Thus, an NPN type transistor is manufactured in the central portion of the semiconductor body. Namely, an $N^+$ region 20, P type region **19*a* and N type region 15*a* function as an emitter, a base and a collector region, respectively. The $N^+$ type region 13 also functions as a part of the collector region. The P type region 19*b* is formed to provide an electrode terminal to the substrate 11 through the $P^+$ type region 14**, whereby direct contact area to the substrate having a good ohmic characteristic can be easily realized.

FIG. 3 shows a modified semiconductor device according to the present invention in which $P^+$ type region **14*a* for preventing a channel layer and $P^+$ type region 14*b* for providing a surface electrode to the substrate are separatedly formed around $N^+$ type buried region 13. Such regions 14*a* and 14*b*** may be formed by simultaneously diffusing a P type impurity and also they may be by different diffusion steps, if necessary.

Although a P type substrate is used in the above-mentioned embodiments, the present invention is applicable also to the case wherein an N type substrate is used.

We claim:

1. A method for manufacturing a semiconductor device comprising the steps of:

a. forming a first semiconductor region of a first conductivity type and a relatively low resistivity partially on a major surface of a semiconductor substrate of a second conductivity type and a relatively high resistivity;

b. forming a second semiconductor region of the second conductivity type and a relatively low resistivity on the major surface of the substrate except for the surface of said first semiconductor region;

c. depositing a semiconductor layer of the first conductivity type and a relatively high resistivity, so as to embed said first and second semiconductor regions thereunder; and d. selectively oxidizing said semiconductor layer from the surface thereof, so as to form an insulating layer of the semiconductor material extending to said second semiconductor region in said semiconductor layer, said insulating layer being connected to said second semiconductor region at the bottom surface thereof and surrounding the portion of said semiconductor layer formed on said first semiconductor region at the side surface thereof.

2. A method for manufacturing a semiconductor device according to claim 1, further including the step of forming a ring-shaped groove in said semiconductor layer, the bottom of said groove extending over at least a portion of said second semiconductor region, and surrounding said first semiconductor region, subsequent to step (c) and prior to step (d).

3. A method for manufacturing a semiconductor device according to claim 1, wherein said step (c) comprises the step of epitaxially depositing said semiconductor layer upon said first and second semiconductor regions, so that the conductivity determining impurity of said second semiconductor region moves into said epitaxially deposited layer during the deposition thereof.

4. A method for manufacturing a semiconductor device according to claim 2, wherein said step (c) comprises the step of epitaxially depositing said semiconductor layer upon said first and second semiconductor regions, so that the conductivity determining impurity of said second semiconductor region moves into said epitaxially deposited layer during the deposition thereof.

5. A method for manufacturing a semiconductor device according to claim 1, further including the step of forming at least one additional semiconductor region in said deposited semiconductor layer to form at least one pn junction therein.

6. A method for manufacturing a semiconductor device according to claim 2, wherein said steps (a) and (b) each comprises diffusing respective first and second conductivity type determining impurities into said substrate to first and second respective depths.

7. A method for manufacturing a semiconductor device according to claim 2, wherein step (b) comprises the step of growing a heavily doped second conductivity type layer on the surface of said substrate adjacent said first region.

* * * * *